United States Patent
Kuo et al.

(10) Patent No.: US 7,701,289 B2
(45) Date of Patent: Apr. 20, 2010

(54) VARIABLE GAIN AMPLIFIER INCLUDING SERIES-COUPLED CASCODE AMPLIFIERS

(75) Inventors: Ming-Ching Kuo, Hsinchu (TW); Shiau-Wen Kao, Hsinchu (TW); Chih-Hung Chen, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 15 days.

(21) Appl. No.: 12/076,289

(22) Filed: Mar. 17, 2008

(65) Prior Publication Data

US 2009/0108935 A1   Apr. 30, 2009

Related U.S. Application Data

(60) Provisional application No. 60/996,017, filed on Oct. 25, 2007, provisional application No. 60/960,984, filed on Oct. 24, 2007.

(51) Int. Cl.
*H03F 3/45* (2006.01)
(52) U.S. Cl. .................... 330/254; 330/51; 330/133; 330/253
(58) Field of Classification Search .............. 330/51, 330/98, 133, 253, 254, 261, 278, 285, 311
See application file for complete search history.

(56) References Cited

U.S. PATENT DOCUMENTS

| | | | |
|---|---|---|---|
| 5,077,541 A | 12/1991 | Gilbert | |
| 6,100,761 A | 8/2000 | Ezell | |
| 6,218,899 B1 | 4/2001 | Ezell | |
| 6,288,609 B1 | 9/2001 | Brueske et al. | |
| 6,445,251 B1 | 9/2002 | Robinson | |
| 6,522,195 B2 | 2/2003 | Watanabe et al. | |
| 6,577,185 B1 * | 6/2003 | Chandler et al. | 330/133 |
| 6,657,498 B2 | 12/2003 | Park et al. | |
| 6,819,179 B2 | 11/2004 | Raja et al. | |
| 6,930,546 B2 | 8/2005 | Floyd | |
| 6,933,779 B2 | 8/2005 | Lee et al. | |
| 7,076,226 B2 | 7/2006 | Bult et al. | |
| 7,110,742 B2 | 9/2006 | Roufoogaran | |
| 2008/0258821 A1 * | 10/2008 | Zhou | 330/133 |

* cited by examiner

*Primary Examiner*—Khanh V Nguyen
(74) *Attorney, Agent, or Firm*—Finnegan, Henderson, Farabow, Garrett & Dunner, LLP

(57) ABSTRACT

A variable gain amplifier to convert an amplifier input voltage to an amplifier output voltage, the variable gain amplifier includes: a plurality of cascode amplifiers coupled in series; a plurality of switching transistor pair circuits coupled in series; and a bias circuit coupled to provide bias voltages to each of the plurality of cascode amplifiers; wherein each of the switching transistor pair circuits is further coupled between two consecutive ones of the cascode amplifiers; a first one of the cascode amplifiers is configured to receive the amplifier input voltage; and a last one of the cascode amplifiers is configured to provide the amplifier output voltage.

26 Claims, 12 Drawing Sheets

US 7,701,289 B2

VARIABLE GAIN AMPLIFIER INCLUDING SERIES-COUPLED CASCODE AMPLIFIERS

RELATED APPLICATIONS

This application is based upon and claims the benefit of priority from Provisional Application No. 60/960,984, filed Oct. 24, 2007, and Provisional Application No. 60/996,017, filed Oct. 25, 2007, the entire contents of which are incorporated herein by reference.

FIELD OF THE INVENTION

This invention pertains in general to analog circuitry and, more particularly, to a variable gain amplifier including cascode amplifiers.

BACKGROUND OF THE INVENTION

A variable gain amplifier (VGA) is an analog circuit that can be used in a front-end receiver in a communication device to amplify or attenuate received signals. For example, when strength of a radio frequency (RF) signal received by the receiver is relatively low, the variable gain amplifier may amplify the RF signal prior to the RF signal being down-converted to a lower frequency. Also, for example, when the strength of the received RF signal is relatively high, the variable gain amplifier may provide increased linearity to the RF signal by decreasing the gain.

FIG. 1 illustrates a conventional variable gain amplifier 100. The variable gain amplifier 100 includes a pair of differentially connected metal-oxide-semiconductor (MOS) transistors M1 102 and M2 104. The MOS transistor M1 102 includes a gate terminal 106, a drain terminal 108, and a source terminal 110. The MOS transistor M2 104 includes a gate terminal 112, a drain terminal 114, and a source terminal 116. The gate terminal 106 of the MOS transistor M1 102 is coupled to a first input terminal 118 of the variable gain amplifier 100. The gate terminal 112 of the MOS transistor M2 104 is coupled to a second input terminal 120 of the variable gain amplifier 100. The drain terminal 108 of the MOS transistor M1 102 is coupled to a first resistor 122 with an adjustable resistance value and a first output terminal 124 of the variable gain amplifier 100. The drain terminal 114 of the MOS transistor M2 104 is coupled to a second resistor 126 with an adjustable resistance value and a second output terminal 128 of the variable gain amplifier 100. The source terminal 110 of the MOS transistor M1 102 and the source terminal 116 of the MOS transistor M2 104 are connected together to be driven from a constant current source $I_s$ 130. By adjusting the resistance values of the first and second resistors 122 and 126, the amplifier 100 may provide a variable gain to a first voltage $V_{in}$ applied at the input terminals 118 and 120, and output a second voltage $V_{out}$ at the output terminals 124 and 128.

Typically, distortion is a consideration in the design of the variable gain amplifier. It is desired that the variable gain amplifier has a wide linear input range. For example, when the receiver receives a signal on a desired frequency channel, it may also receive an interference signal on an adjacent frequency channel, which may have a detrimental effect on the signal received on the desired frequency channel. If the variable gain amplifier has a wide linear input range, the variable gain amplifier may provide increased linearity to the received signal by decreasing the gain. As a result, the variable gain amplifier with a wide linear input range may provide an increased signal-to-noise/interference ratio to its output signal.

SUMMARY OF THE INVENTION

In accordance with the invention, there is provided a variable gain amplifier to convert an amplifier input voltage to an amplifier output voltage, the variable gain amplifier comprising: a plurality of cascode amplifiers coupled in series; a plurality of switching transistor pair circuits coupled in series; and a bias circuit coupled to provide bias voltages to each of the plurality of cascode amplifiers; wherein each of the switching transistor pair circuits is further coupled between two consecutive ones of the cascode amplifiers; a first one of the cascode amplifiers is configured to receive the amplifier input voltage; and a last one of the cascode amplifiers is configured to provide the amplifier output voltage.

Also in accordance with the invention, there is provided a variable gain amplifier to convert an amplifier input voltage to an amplifier output voltage, the variable gain amplifier comprising: first and second cascode amplifiers coupled in series; a transistor pair circuit coupled to the first and second cascode amplifiers; and a bias circuit coupled to provide bias voltages to each of the first and second cascode amplifiers; wherein the first cascode amplifier is configured to receive the amplifier input voltage, and the second cascode amplifier is configured to provide the amplifier output voltage.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate embodiments of the invention and, together with the description, serve to explain the principles of the invention.

DESCRIPTION OF THE EMBODIMENTS

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments consistent with the present invention do not represent all implementations consistent with the invention. Instead, they are merely examples of systems and methods consistent with aspects related to the invention as recited in the appended claims.

In exemplary embodiments consistent with the present invention, there is provided a variable gain amplifier that includes series-coupled cascode amplifiers. For example, a cascode amplifier may include a first pair of transistors in common-source or common-gate configuration, i.e., a transconductor, coupled to a second pair of transistors in common-gate configuration, i.e., a current buffer.

More particularly, in exemplary embodiments, the variable gain amplifier is configured to perform current-mode switching and may include a plurality of cascode amplifiers coupled in series, at least one switching transistor pair circuit, and a bias circuit. Each of the cascode amplifiers includes a transconductor, a current buffer, and a load coupled in series. The variable gain amplifier so configured has a wide linear input range.

Figure 1:
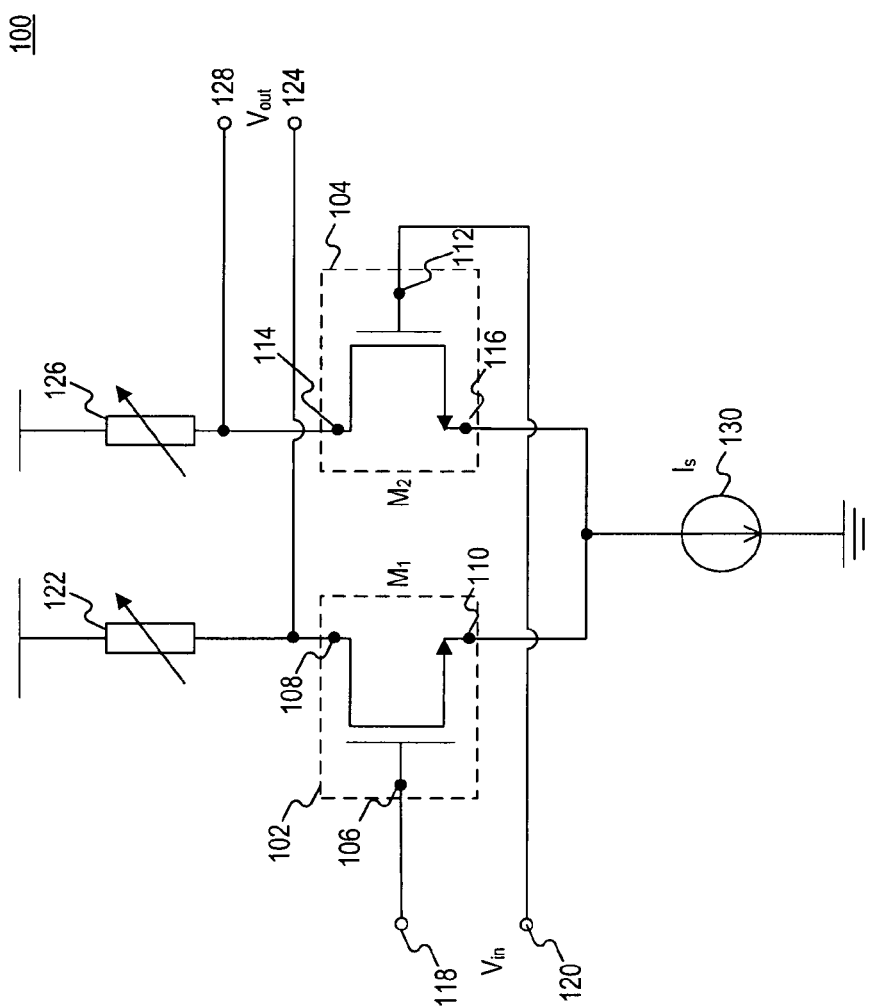
FIG. 1 illustrates a conventional variable gain amplifier.
Figure 2A:
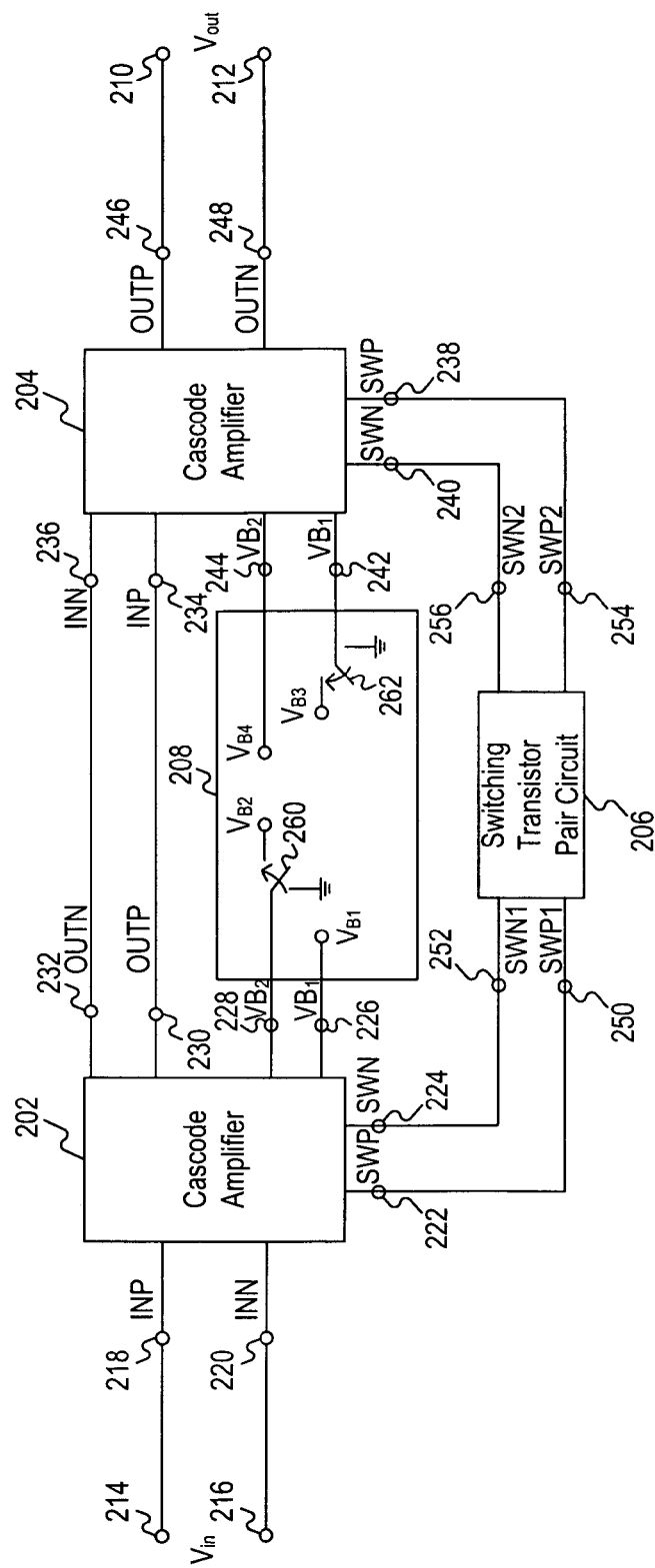
FIGS. 2A and 2B illustrate schematic block diagrams of a two-stage variable gain amplifier according to exemplary embodiments.
Figure 2B:
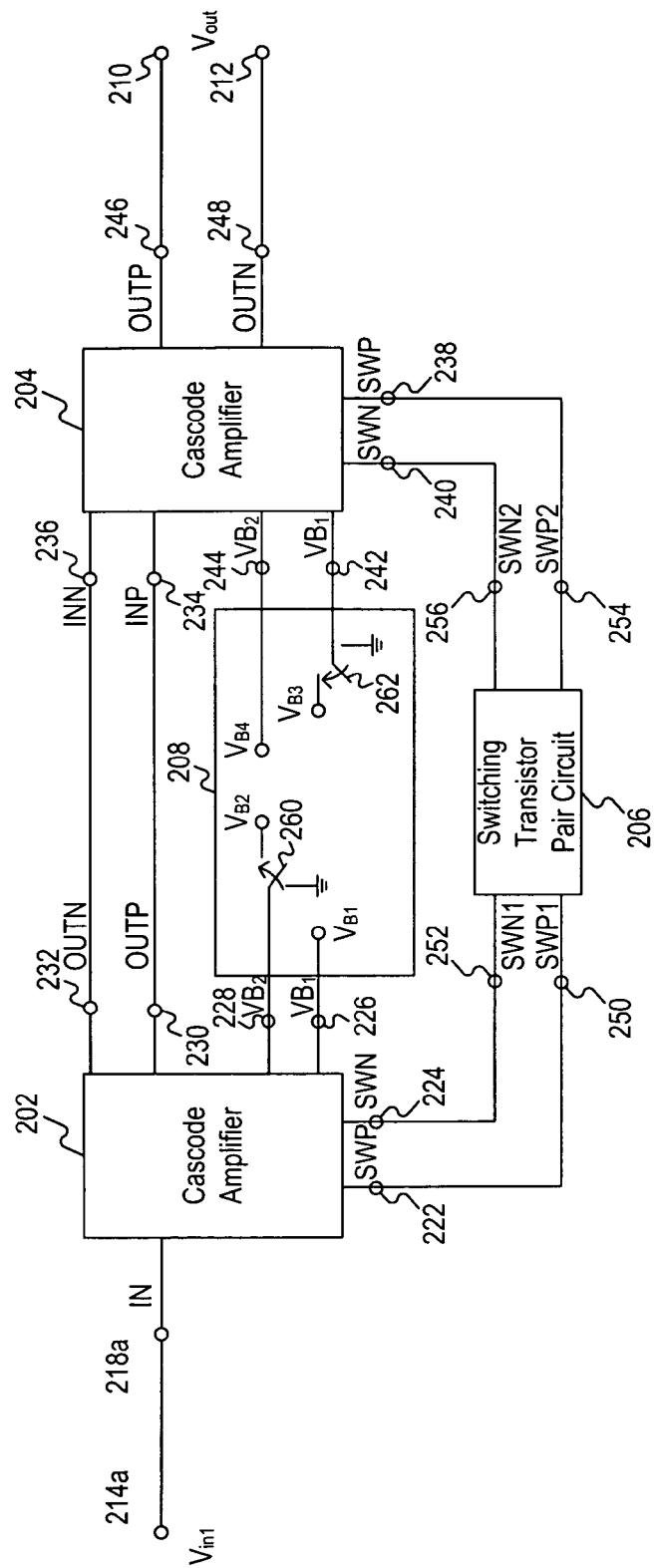

FIGS. 2A and 2B illustrate schematic block diagrams of a two-stage variable gain amplifier 200 including current-mode switching, according to exemplary embodiments. The variable gain amplifier 200 includes a first cascode amplifier 202, a second cascode amplifier 204, and a switching transistor pair circuit 206. In addition, the variable gain amplifier 200 includes a bias circuit 208, and first and second output terminals 210 and 212 to provide an output voltage $V_{out}$. The variable gain amplifier 200 may include first and second input terminals 214 and 216 to receive a differential input voltage $V_{in}$, as shown in FIG. 2A. Alternatively, as shown in FIG. 2B, the variable gain amplifier 200 may include a first input terminal 214a to receive a single-phase input voltage $V_{in1}$.

Referring to FIG. 2A, the first cascode amplifier 202 has first and second input terminals INP 218 and INN 220, first and second switching terminals SWP 222 and SWN 224, first and second bias terminals VB1 226 and VB2 228, and first and second output terminals OUTP 230 and OUTN 232. The first and second input terminals 218 and 220 of the first cascode amplifier 202 are coupled to the first and second input terminals 214 and 216, respectively, of the variable gain amplifier 200. Alternatively, as shown in FIG. 2B, the first cascode amplifier 202 has an input terminal IN 218a. The input terminal 218a of the first cascode amplifier 202 is coupled to the input terminal 214a of the variable gain amplifier 200.

Referring to FIGS. 2A and 2B, the second cascode amplifier 204 has first and second input terminals INP 234 and INN 236, first and second switching terminals SWP 238 and SWN 240, first and second bias terminals VB1 242 and VB2 244, and first and second output terminals OUTP 246 and OUTN 248. The first and second input terminals 234 and 236 are coupled to the first and second output terminals 230 and 232, respectively, of the first cascode amplifier 202. The first and second output terminals 246 and 248 are coupled to the first and second output terminals 210 and 212, respectively, of the variable gain amplifier 200.

The switching transistor pair circuit 206 has first and second input terminals SWP1 250 and SWN1 252 respectively coupled to the first and second switching terminals 222 and 224 of the first cascode amplifier 202, and first and second output terminals SWP2 254 and SWN2 256 respectively coupled to the first and second switching terminals 238 and 240 of the second cascode amplifier 204.

The bias circuit 208 is configured to provide first and second bias voltages $V_{B1}$ and $V_{B2}$ to the first cascode amplifier 202 via the bias terminals 226 and 228, respectively, and to provide third and fourth bias voltages $V_{B3}$ and $V_{B4}$ to the second cascode amplifier 204 via the bias terminals 242 and 244, respectively. The bias circuit 208 further includes first and second switches 260 and 262 for coupling the bias terminals 228 and 242 to receive their respective bias voltage $V_{B1}$ and $V_{B2}$, or coupling the bias terminals 228 and 242 to ground, in accordance with a control signal $S_0$ (not shown in FIGS. 2A and 2B) received by the bias circuit 208. In one exemplary embodiment, the control signal $S_0$ may be provided by a digital baseband circuit, i.e., a demodulator circuit. The digital baseband circuit may determine a receiver gain setting based on the strength of signals received by the receiver.

Figure 3A:
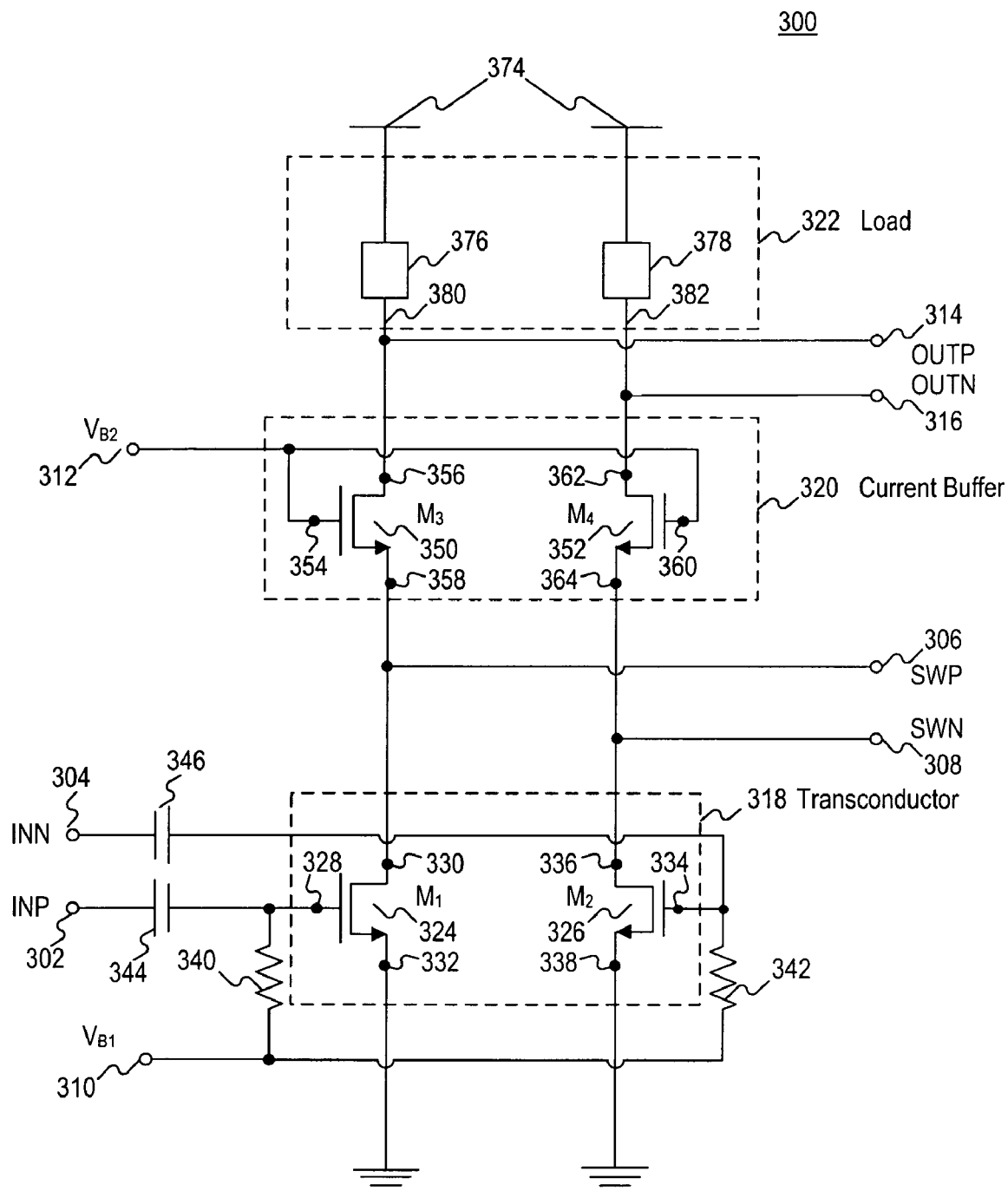
FIGS. 3A-3C illustrate schematic block diagrams of alternative constructions of a cascode amplifier according to exemplary embodiments.
Figure 3B:
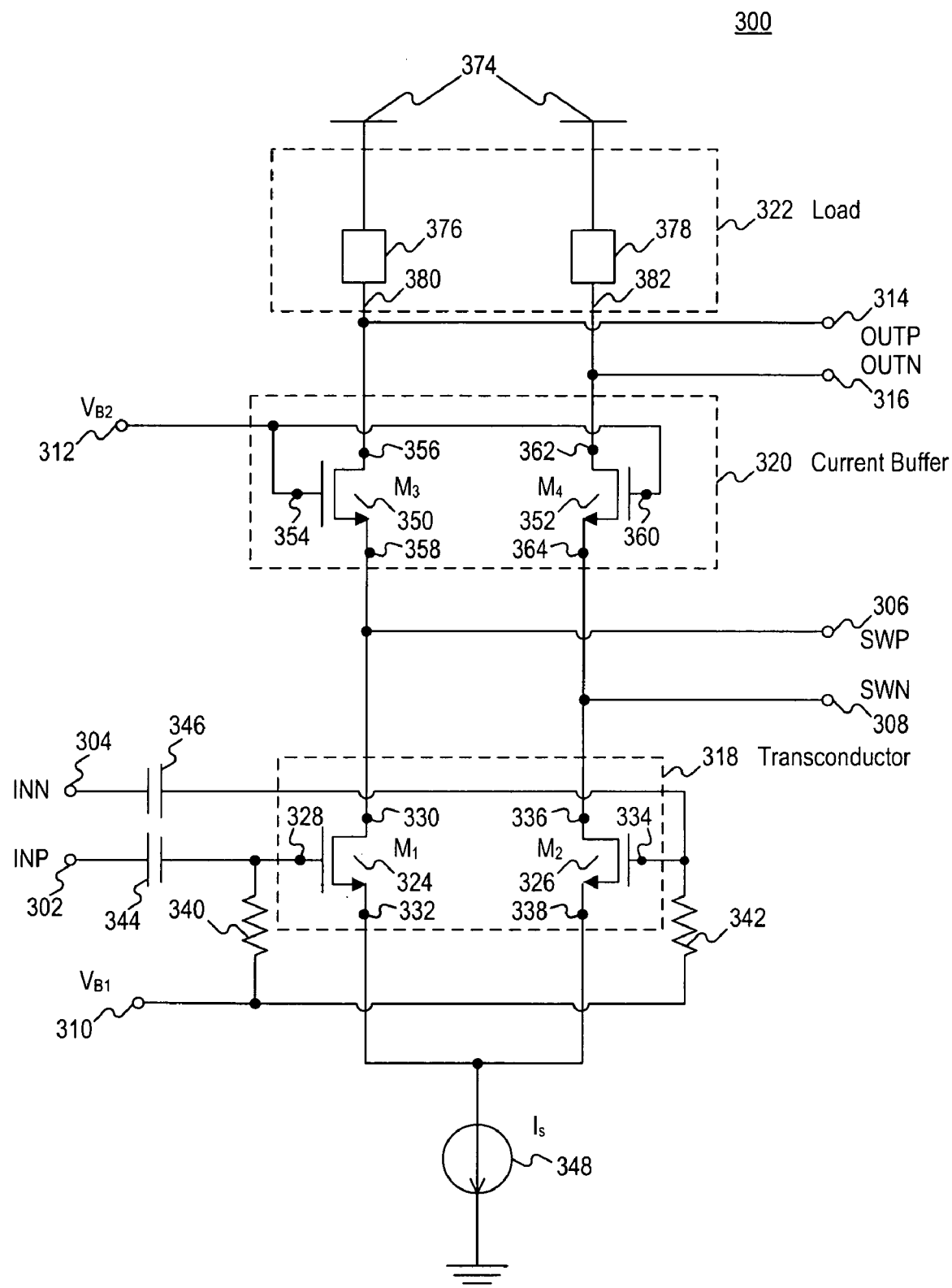
Figure 3C:
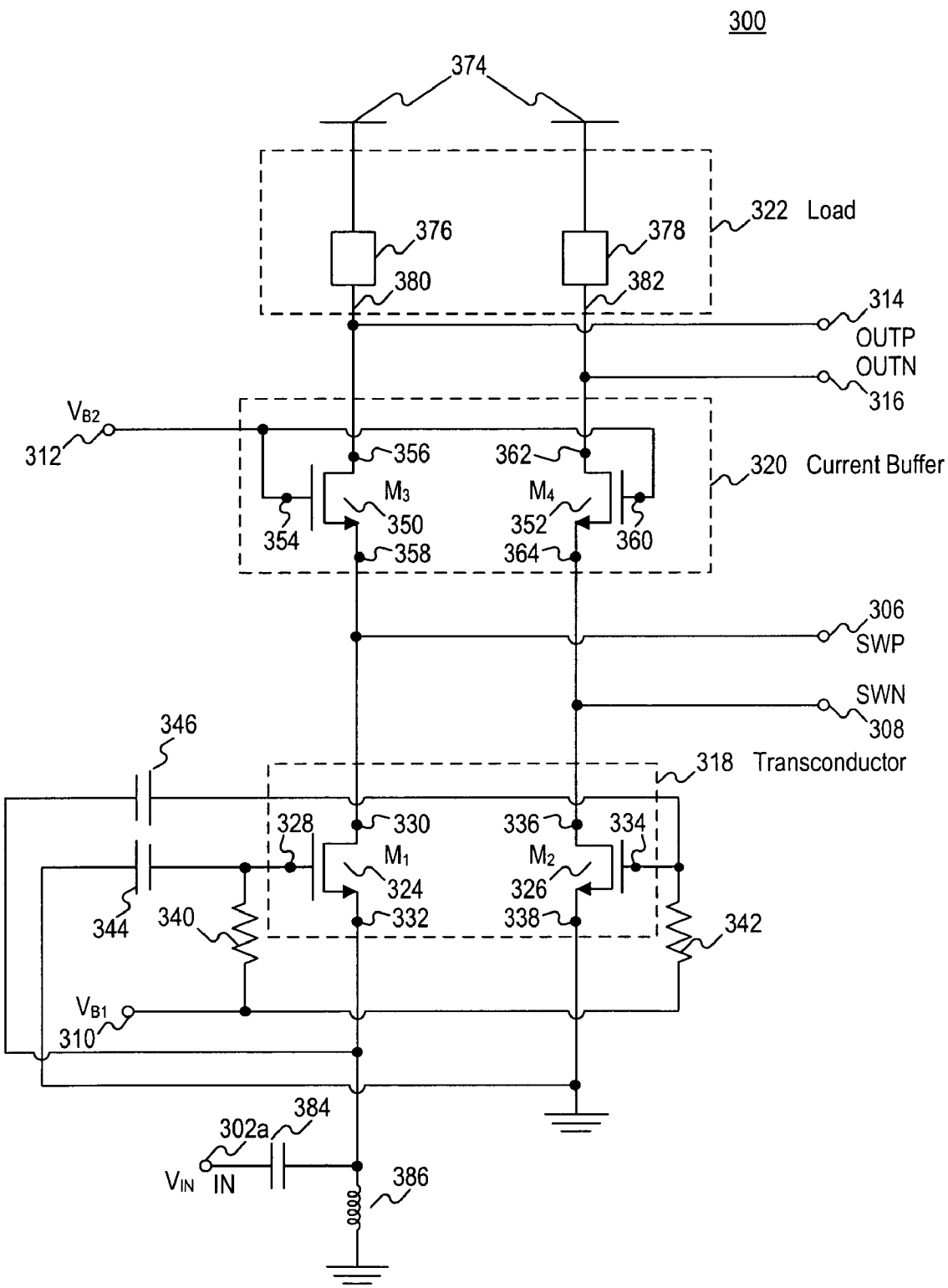

FIGS. 3A-3C illustrate schematic block diagrams of alternative constructions of a cascode amplifier 300 according to exemplary embodiments. For example, the cascode amplifier 300 shown in FIGS. 3A and 3B has first and second input terminals INP 302 and INN 304, and may be implemented as the first cascode amplifier 202 or the second cascode amplifier 204 in the variable gain amplifier 200 (FIGS. 2A and 2B). Also for example, the cascode amplifier 300 shown in FIG. 3C has an input terminal IN 302a, and may be implemented as the first cascode amplifier 202 shown in FIG. 2B having the single input terminal IN 218a. The cascode amplifier 300 may also include first and second switching terminals SWP 306 and SWN 308, first and second bias terminals VB1 310 and VB2 312, and first and second output terminals OUTP 314 and OUTN 316. The cascode amplifier 300 further includes a transconductor 318 to converting an input voltage applied to the input terminals 302 and 304 (FIGS. 3A and 3B) or to the input terminal 302a (FIG. 3C) to a current. The cascode amplifier 300 additionally includes a current buffer 320 coupled in series to the transconductor 318 for receiving the converted current provided by the transconductor 318, and a load 322 coupled in series to the current buffer 320 for converting a current provided by the current buffer 320 to a differential output voltage provided at the output terminals 314 and 316.

Referring to FIGS. 3A-3C, the transconductor 318 includes a first MOS transistor M1 324 and a second MOS transistor M2 326. The first MOS transistor M1 324 includes a first gate terminal 328, a first drain terminal 330, and a first source terminal 332. The second MOS transistor M2 326 includes a second gate terminal 334, a second drain terminal 336, and a second source terminal 338. The first and second gate terminals 328 and 334 are coupled to the bias terminal 310 to receive a first bias voltage $V_{B1}$ via first and second resistors 340 and 342, respectively. In addition, the first and second gate terminals 328 and 334 are coupled to the first and second input terminals 302 and 304 to receive to the input voltage via first and second capacitors 344 and 346, respectively.

In one exemplary embodiment, shown in FIG. 3A, the first and second source terminals 332 and 338 are coupled to ground directly. Alternatively, as shown in FIG. 3B, the transconductor 318 may further include a current source $I_s$ 348 such as a MOS transistor. The first and second source terminals 332 and 338 are coupled to the current source $I_s$ 348, such that the transconductor 318 may be driven by the current source $I_s$ 348.

In one exemplary embodiment, shown in FIG. 3C, the cascode amplifier 300 may be further configured to receive a single-phase input voltage and to operate as a first stage of a variable gain amplifier. Referring to FIG. 3C, the first gate terminal 328 is coupled to the second source terminal 338 via the first capacitor 344, the second gate terminal 334 is coupled to the first source terminal 332 via the second capacitor 346. In addition, the first source terminal 332 is coupled to receive the single-phase input voltage applied at the input terminal 302a via a third capacitor 384, and coupled to ground via an inductor 386.

Referring to FIGS. 3A-3C, the current buffer 320 includes a third MOS transistor M3 350 and a fourth MOS transistor M4 352. The third MOS transistor M3 350 includes a third gate terminal 354, a third drain terminal 356, and a third source terminal 358. The fourth MOS transistor M4 352 includes a fourth gate terminal 360, a fourth drain terminal 362, and a fourth source terminal 364. The third source terminal 358 and the first drain terminal 330 are coupled together to the first switching terminal 306; and the fourth source terminal 364 and the second drain terminal 336 are coupled together to the second switching terminal 308. The third and fourth gate terminals 354 and 360 are directly coupled to the bias terminal 312 to receive a second bias voltage $V_{B2}$.

Figure 3D:
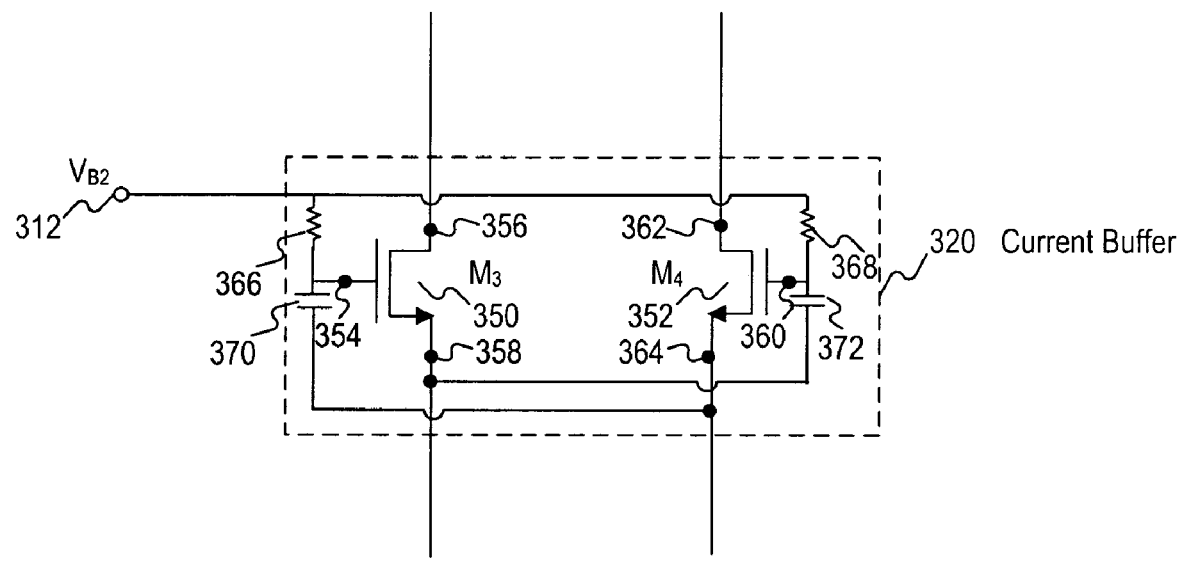
FIG. 3D illustrates a schematic block diagram of an alternative construction of a current buffer according to an exemplary embodiment.

FIG. 3D illustrates a schematic block diagram of an alternative construction of the current buffer 320, according to an exemplary embodiment. In the illustrated embodiment, the current buffer 320 may further include first and second resistors 366 and 368, and first and second capacitors 370 and 372. The third and fourth gate terminals 354 and 360 are coupled to the bias terminal 312 to receive the bias voltage $V_{B2}$ via the first and second resistors 366 and 368, respectively. The first capacitor 370 is coupled between the third gate terminal 354 and the fourth source terminal 364, and the second capacitor 372 is coupled between the fourth gate terminal 360 and the third source terminal 358.

Referring back to FIGS. 3A-3C, the load 322 is coupled between a power supply terminal 374 and the current buffer 320, and includes a pair of components 376 and 378 having substantially the same equivalent resistance value. Each of the components 376 and 378 may include at least one of a resistor, an inductor, or a MOS transistor, or any combination thereof, and have a fixed or adjustable resistance/impedance value. A terminal 380 of the component 376 and the third drain terminal 356 are coupled together to the first output terminal 314. A terminal 382 of the component 378 and the fourth drain terminal 362 are coupled together to the second output terminal 316.

It should be noted that the MOS transistors of the cascode amplifier 300 shown in FIGS. 3A-3C may comprise either all NMOS or all PMOS transistors. In the exemplary embodiments of FIGS. 3A-3C, the MOS transistors in the cascode amplifier 300 comprise NMOS transistors. Alternatively, the MOS transistors in the cascode amplifier 300 may comprise PMOS transistors.

Figure 4A:
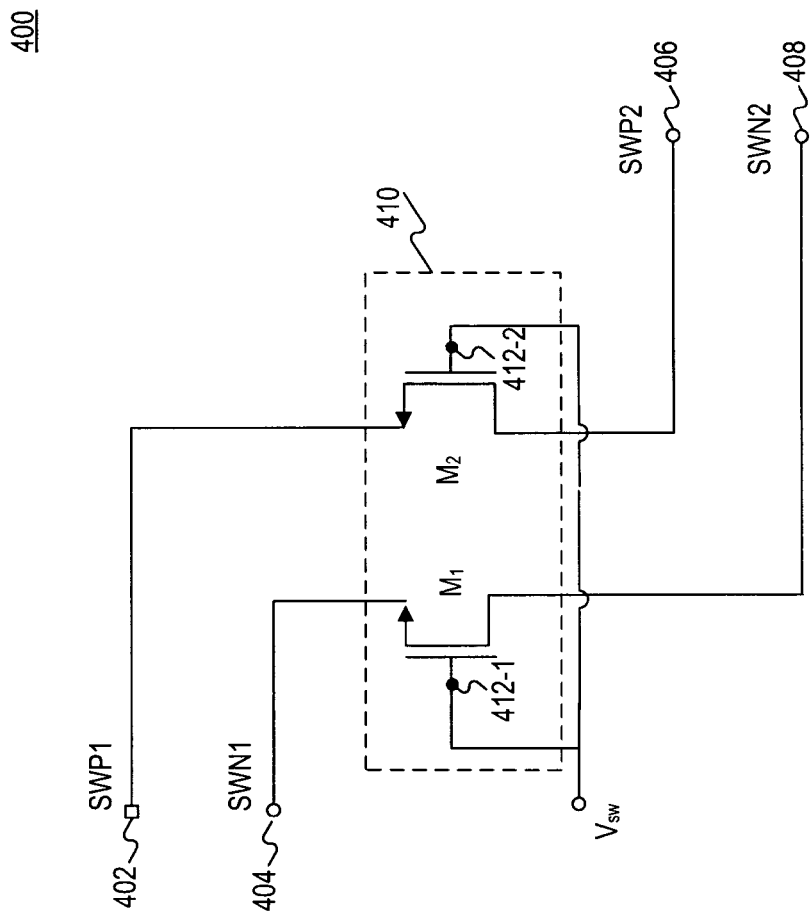
FIGS. 4A and 4B illustrate schematic block diagrams of alternative constructions of a switching transistor pair circuit according to exemplary embodiments.
Figure 4B:
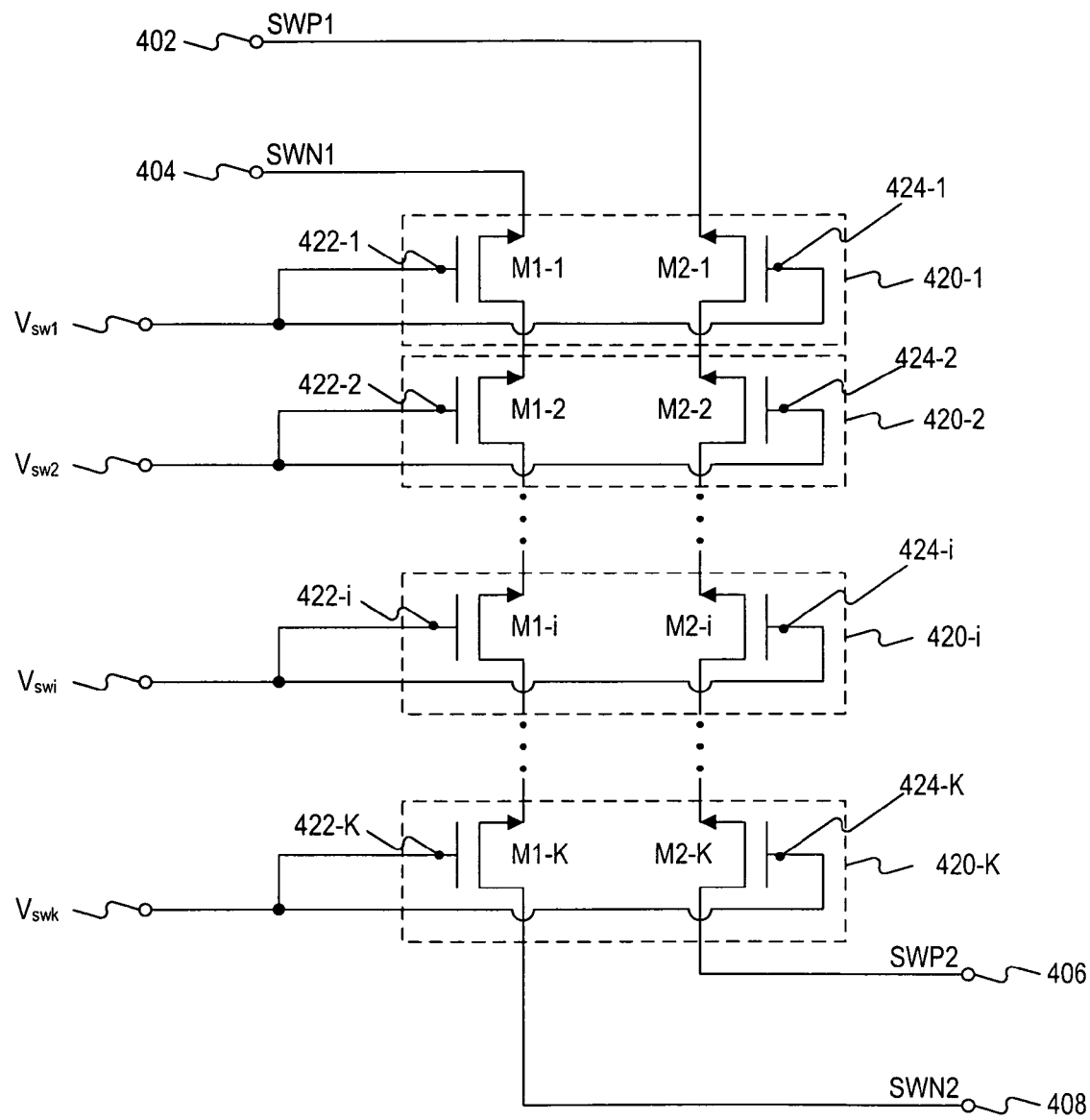

FIGS. 4A and 4B illustrate schematic block diagrams of alternative constructions of a switching transistor pair circuit 400, according to exemplary embodiments. For example, the switching transistor pair circuit 400 may be implemented as the switching transistor pair circuit 206 in the two-stage variable gain amplifier 200 (FIGS. 2A and 2B). The switching transistor pair circuit 400 includes first and second input terminals SWP1 402 and SWN1 404 and first and second output terminals SWP2 406 and SWN2 408, respectively corresponding to the first and second input terminals 250 and 252 and the first and second output terminals 254 and 256 of the switching transistor pair circuit 206 (FIGS. 2A and 2B).

In one exemplary embodiment, shown in FIG. 4A, the switching transistor pair circuit 400 further includes a transistor pair 410. The transistor pair 410 includes a first MOS transistor M1 and a second MOS transistor M2. The MOS transistors M1 and M2 have first and second gate terminals 412-1 and 412-2, respectively. The first and second gate terminals 412-1 and 412-2 are coupled together to receive a switching voltage $V_{sw}$, in accordance with the control signal $S_O$ (not shown in FIG. 4A) noted above. For example, a first value of the switching voltage $V_{sw}$ may turn on the switching transistor pair circuit 400 by turning on the transistor pair 410. As a result, a signal applied at the input terminals SWP1 402 and SWN1 404 may pass through the switching transistor pair circuit 400, such that an output signal is provided at the output terminals SWP2 406 and SWN2 408. Also, for example, a second value of the switching voltage $V_{sw}$ may turn off the switching transistor pair circuit 400, such that the signal applied at the input terminals SWP1 402 and SWN1 404 may not pass through the switching transistor pair circuit 400.

In one exemplary embodiment, shown in FIG. 4B, the switching transistor pair circuit 400 includes a plurality of transistor pairs 420-1, 420-2, . . . , 420-K (K is the total number of the transistor pairs) coupled in series, each transistor pair 420-i (i=1, 2, . . . , K) including first and second MOS transistors M1-i and M2-i. The MOS transistors M1-i and M2-i have first and second gate terminals 422-i and 424-i (i=1, 2, . . . , K), respectively. The first and second gate terminals 422-i and 424-i are coupled together to receive a switching voltage $V_{swi}$ (i=1, 2, . . . , K), in accordance with the control signal $S_O$ noted above. For example, a first group of the switching voltage values $V_{sw1}, V_{sw2}, \ldots, V_{swk}$ may turn on the switching transistor pair circuit 400 by turning on each transistor pair 420-1, 420-2, . . . , 420-K. As a result, a signal applied at the input terminals SWP1 402 and SWN1 404 may pass through the switching transistor pair circuit 400, such that an output signal is provided at the output terminals SWP2 406 and SWN2 408. Also, for example, a second group of the switching voltage values $V_{sw1}, V_{sw2}, \ldots, V_{swk}$ may turn off each transistor pair 420-1, 420-2, . . . , 420-K, such that the signal applied at the input terminals SWP1 402 and SWN1 404 may not pass through the switching transistor pair circuit 400.

It should be noted that the MOS transistors of the switching transistor pair circuit 400 may comprise all NMOS transistors, or all PMOS transistors, or NMOS and PMOS transistors. In the exemplary embodiments of FIGS. 4A and 4B, the switching transistor pair circuit 400 comprises all NMOS transistors. Alternatively, the MOS transistors in the switching transistor pair circuit 400 may comprise all PMOS transistors, or NMOS and PMOS transistors.

Figure 5A:
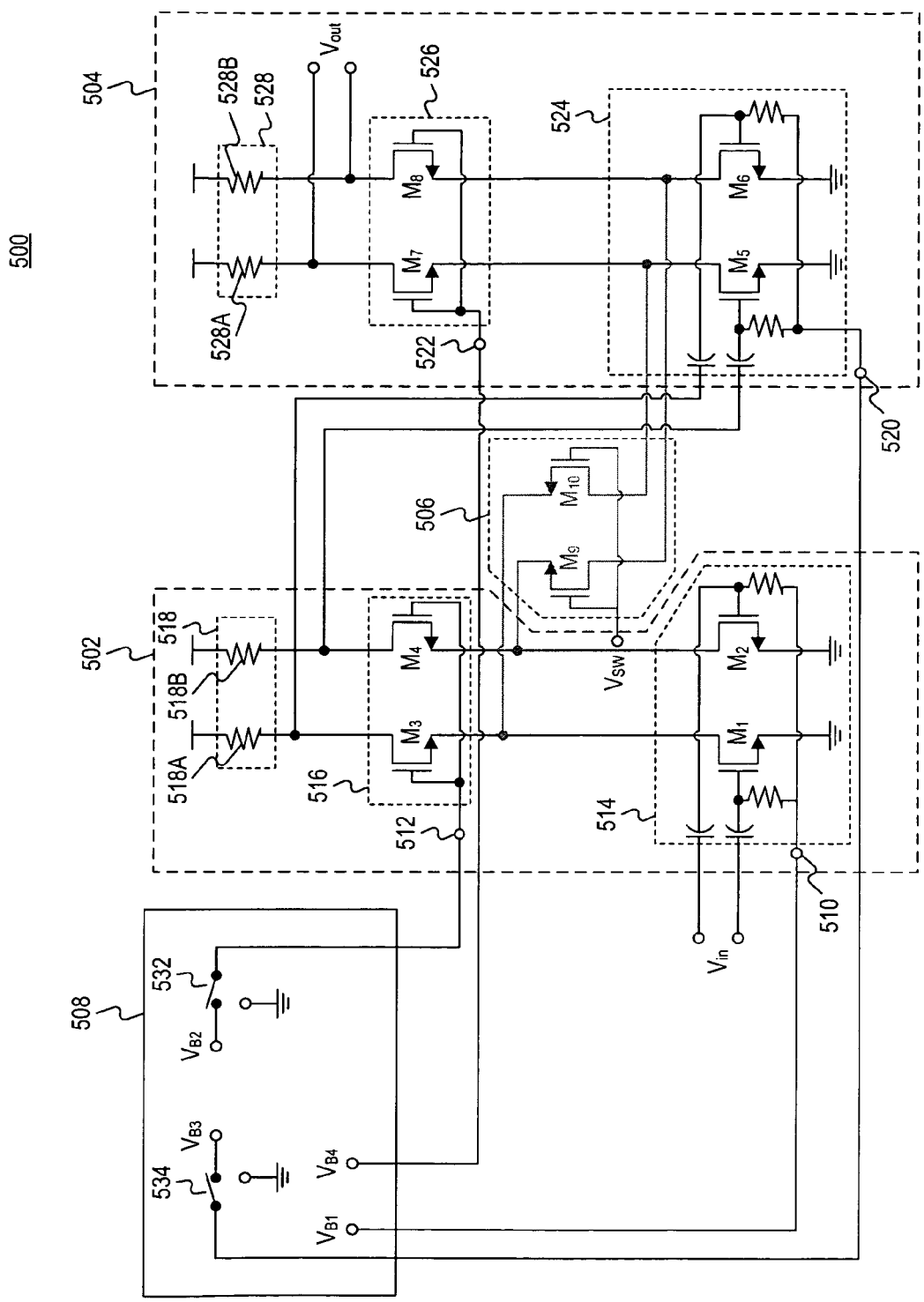
FIGS. 5A and 5B illustrate operation of a two-stage variable gain amplifier according to an exemplary embodiment.
Figure 5B:
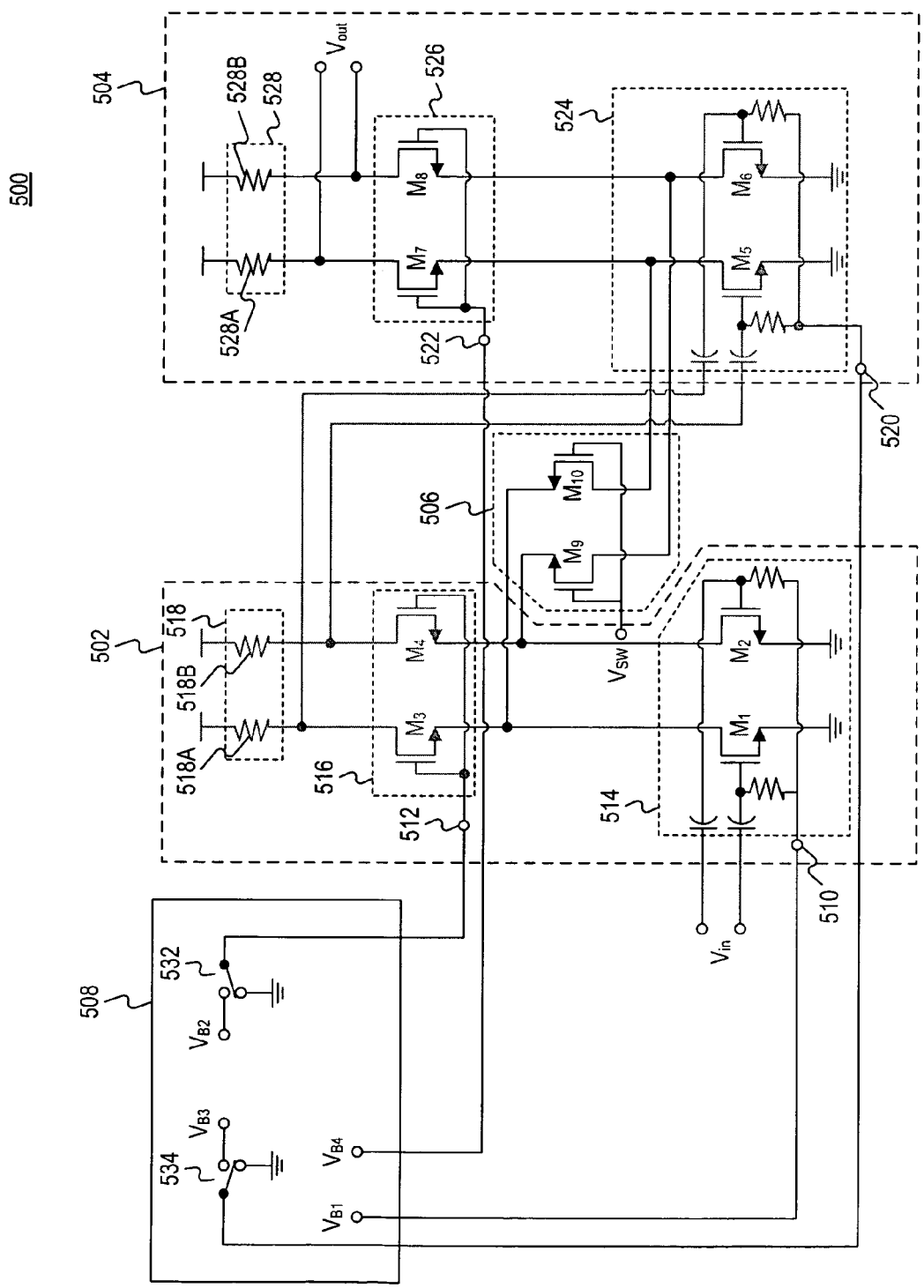

FIGS. 5A and 5B illustrate operation of a two-stage variable gain amplifier 500 including current-mode switching, according to an exemplary embodiment. The variable gain amplifier 500 is configured in general correspondence to the variable gain amplifier 200 (FIG. 2A) and includes a first cascode amplifier 502, a second cascode amplifier 504, a switching transistor pair circuit 506, and a bias circuit 508 that respectively correspond to the first cascode amplifier 202, the second cascode amplifier 204, the switching transistor pair 206, and the bias circuit 208 of the variable gain amplifier 200. The cascode amplifier 502 is configured in general correspondence to the cascode amplifier 300 (FIG. 3A) and includes first and second bias terminals VB1 510 and VB2 512, a transconductor 514, a current buffer 516, and a load 518 that respectively correspond to the first and second bias terminals 310 and 312, the transconductor 318, the current buffer 320, and the load 322 of the cascode amplifier 300. The cascode amplifier 504 is also configured in general correspondence to the cascode amplifier 300 (FIG. 3A) and includes first and second bias terminals VB1 520 and VB2 522, a transconductor 524, a current buffer 526, and a load 528 that respectively correspond to the first and second bias terminals 310 and 312, the transconductor 318, the current buffer 320, and the load 322 of the cascode amplifier 300. The switching transistor pair circuit 506 is configured to generally correspond to the switching transistor pair circuit 400 (FIG. 4A) and is coupled to receive a switching voltage $V_{SW}$ in the same manner as shown in FIG. 4A. The bias circuit 508 is configured to provide bias voltages to the first and second cascode amplifiers 502 and 504. For example, the bias circuit is coupled to provide bias voltages $V_{B1}$ and $V_{B4}$ to the bias terminals 510 and 522, respectively. The bias circuit 508 also includes first and second switches 532 and 534 coupled to the bias terminals 512 and 520 to selectively provide first and second bias voltages $V_{B2}$ and $V_{B3}$, respectively.

In addition, the transconductor 514 has a first transconductance value $g_1$, and the transconductor 524 has a second transconductance value $g_2$. The load 518 includes first and second resistors 518A and 518B each having a first resistance value $R_1$, and the load 528 has first and second resistors 528A and 528B each having a second resistance value $R_2$.

In exemplary embodiments consistent with the present invention, the variable gain amplifier 500 may operate in a high-gain mode (FIG. 5A) or a low-gain mode (FIG. 5B). Referring to FIG. 5A, when the bias circuit 508 receives a control signal $S_0$ (not shown in FIG. 5A) causing the amplifier 500 to operate in the high-gain mode, the switching transistor pair circuit 506 receives a first value of the switching voltage $V_{SW}$ to turn off the switching transistor pair circuit 506. In FIG. 5A, the switching transistor pair circuit 506 is shown in gray ink to indicate its inactivity. At the same time, the control signal $S_0$ causes the switches 532 and 534 to close to turn on the current buffer 516 and the transconductor 524 by coupling the bias terminals 512 and 520 to the bias voltages $V_{B2}$ and $V_{B3}$, respectively. A differential input voltage $V_{in}$ applied to the variable gain amplifier 500 is amplified by the first cascode amplifier 502 with a first gain equal to $g_1*R_1$ and further amplified by the second cascode amplifier 504 with a second gain equal to $g_2*R_2$. As a result, the variable gain amplifier 500 may provide an output voltage $V_{out}$ with a total gain equal to $g_1*R_1*g_2*R_2$ when operating in the high-gain mode.

Referring to FIG. 5B, when the switching transistor pair circuit 506 receives the control signal $S_0$ (not shown in FIG. 5B) causing the amplifier 500 to operate in the low-gain mode, the switching transistor pair circuit 506 receives a second value of the switching voltage $V_{SW}$ to turn on the switching transistor pair circuit 506. At the same time, the control signal $S_0$ causes the switches 532 and 534 to open to turn off the current buffer 516 and the transconductor 524 by coupling the bias terminals 512 and 520 to ground. In FIG. 5B, the current buffer 516, the load 518, and the transconductor 524 are shown in gray ink to indicate their inactivity. Accordingly, instead of flowing through the current buffer 516, a current provided by the transconductor 514 based on the input voltage $V_{in}$ flows through the switching transistor pair circuit 506 and the current buffer 526. As a result, the transconductor 514, the switching transistor pair circuit 506, the current buffer 526, and the load 528 form a new cascode amplifier. Therefore the variable gain amplifier 500 may provide a total gain equal to $g_1*R_2$ when operating in the low-gain mode.

Figure 6:
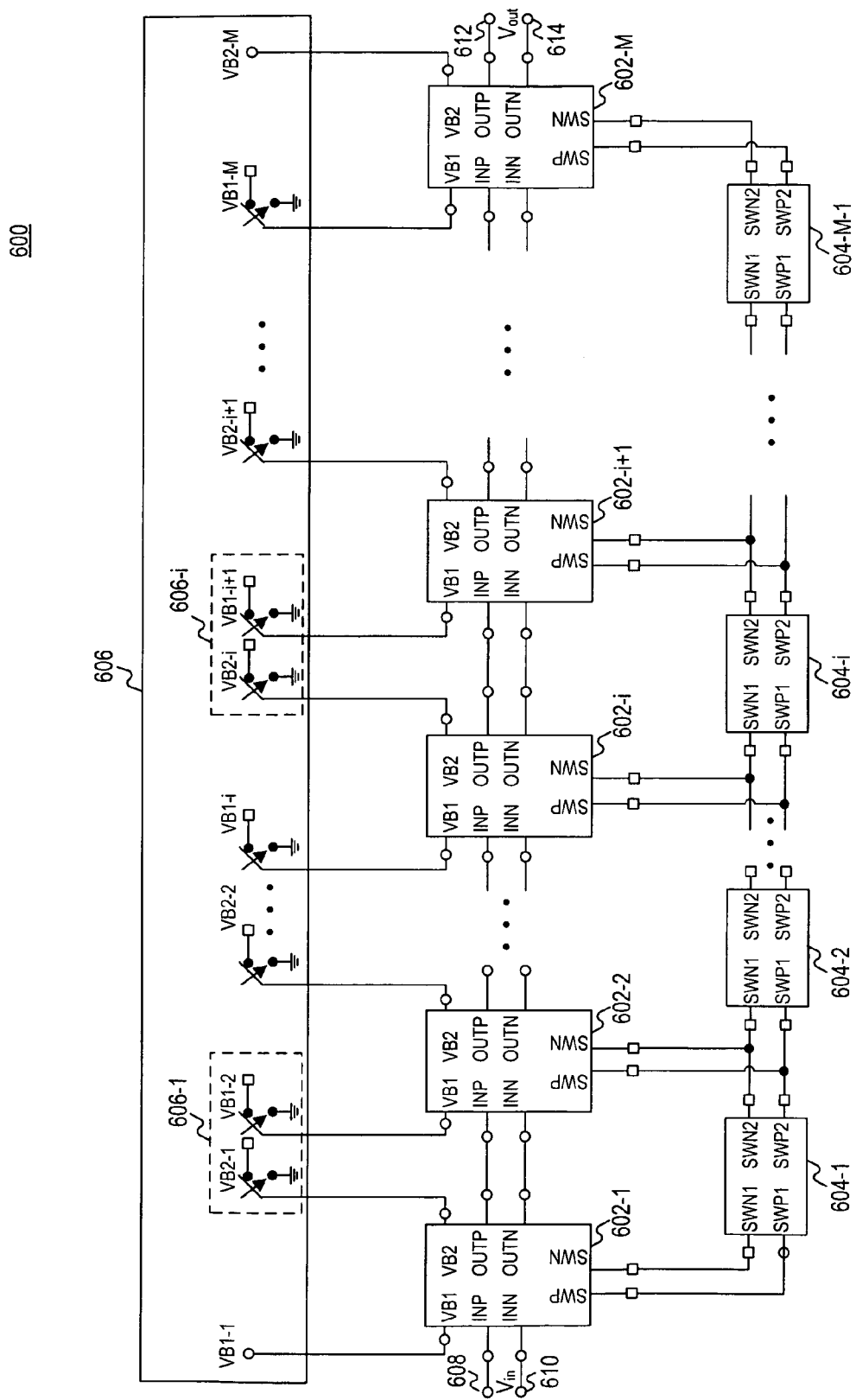
FIG. 6 illustrates a schematic block diagram of an M-stage variable gain amplifier according to an exemplary embodiment.

FIG. 6 illustrates a schematic block diagram of an M-stage variable gain amplifier 600 including current-mode switching (M is an integer larger than two), according to an exemplary embodiment. The variable gain amplifier 600 includes M cascode amplifiers 602-1, 602-2, ..., 602-M, each of which is configured to correspond to the cascode amplifier 300 shown in FIG. 3A or 3B. For example, the cascode amplifiers 602-1, 602-2, ..., 602-M may have the same construction shown in either FIG. 3A or FIG. 3B. Also, for example, one or ones of the cascode amplifiers 602-1, 602-2, ..., 602-M may have the construction shown in FIG. 3A, and remaining one or ones of the cascode amplifiers 602-1, 602-2, ..., 602-M may have the construction shown in FIG. 3B. The variable gain amplifier 600 also includes M−1 switching transistor pair circuits 604-1, 604-2, ..., 604-M−1, each of which is configured to correspond to the switching transistor pair circuit 400 shown in FIG. 4A or 4B. For example, the switching transistor pair circuits 604-1, 604-2, ..., 604-M−1 may have the same construction shown in either FIG. 4A or FIG. 4B. Also, for example, one or ones of the switching transistor pair circuits 604-1, 604-2, ..., 604-M−1 may have the construction shown in FIG. 4A, and remaining one or ones of the switching transistor pair circuits 604-1, 604-2, ..., 604-M−1 may have the construction shown in FIG. 4B. The M-stage variable gain amplifier 600 further includes a bias circuit 606, first and second input terminals 608 and 610 to receive an input voltage $V_{in}$, and first and second output terminals 612 and 614 to provide an output voltage $V_{out}$. The input terminals INP and INN of the first cascode amplifier 602-1 are respectively coupled to the first and second input terminals 608 and 610 of the variable gain amplifier 600, and the output terminals OUTP and OUTN of the $M^{th}$ cascode amplifier 602-M are respectively coupled to the first and second output terminals 612 and 614 of the variable gain amplifier 600.

In exemplary embodiments consistent with the present invention, the cascode amplifiers 602-1, 602-2, ..., 602-M are coupled in series such that the first and second output terminals OUTP and OUTN of the cascode amplifiers 602-1, 602-2, ..., 602-M−1 are respectively coupled to first and second input terminals INP and INN of the cascode amplifiers 602-2, 602-3, ..., 602-M. Also in exemplary embodiments consistent with the present invention, the switching transistor pair circuits 604-1, 604-2, ..., 604-M−1 are coupled in series such that the first and second output terminals SWP2 and SWN2 of the switching transistor pair circuits 604-1, 604-2, ..., 604-M−2 are respectively coupled to the first and second input terminals SWP1 and SWN1 of the switching transistor pair circuits 604-2, 604-3, ..., 604-M−1. Further, the switching transistor pair circuit 604-$i$ is coupled between the two consecutive cascode amplifiers 602-$i$ and 602-$i$+1 ($i$=1, 2, ..., M−1).

For example, as shown in FIG. 6, the first and second input terminals SWP1 and SWN1 of the switching transistor pair circuit 604-$i$ are coupled to the first and second switching terminals SWP and SWN of the cascode amplifier 602-$i$, respectively, and the first and second output terminals SWP2 and SWN2 of the switching transistor pair circuit 604-$i$ are coupled to the first and second switching terminals SWP and SWN of the cascode amplifier 602-$i$+1, respectively.

The bias circuit 606 is configured to provide bias voltages to the M cascode amplifiers 602-1, 602-2, ..., 602-M. The bias circuit 606 further includes M−1 pairs of switches 606-1, 606-2, ..., and 606-M−1. For example, an $i^{th}$ pair of switches 606-$i$ are coupled to the current buffer of the cascode amplifier 602-$i$ via the bias terminal VB2 and the transconductor of the cascode amplifier 602-$i$+1 via the bias terminal VB1, respectively.

In exemplary embodiments consistent with the present invention, the variable gain amplifier 600 may provide a variable gain to the input voltage $V_{in}$, based on the control signal $S_0$ (not shown in FIG. 6) received by the bias circuit 606. The control signal $S_0$ may determine different combinations of the switching transistor pair circuits 604-1, 604-2, ..., 604-M−1 to be turned on and each corresponding transconductor and current buffer in the M cascode amplifiers 602-1, 602-2, ..., 602-M to be turned off.

For example, based on the control signal $S_0$, the switching transistor pair circuit 604-$i$ ($i$=1, 2, ..., M−1) may receive a first value of a switching voltage $V_{swi}$ that turns on the switching transistor pair circuit 604-$i$. At the same time, in accordance with the control signal $S_0$, the pair of switches 606-$i$ in the bias circuit 606 open to turn off the corresponding current buffer in the cascode amplifier 602-$i$ and the corresponding transconductor in the cascode amplifier 602-$i$+1. As a result, for example, the pair of switches 606-$i$ would couple the bias terminal VB2 of the cascode amplifier 602-$i$ and the bias terminal VB1 of the cascode amplifier 602-$i$+1 to ground.

Alternatively, also based on the control signal $S_0$, the switching transistor pair circuit 604-$i$ may receive a second value of the switching voltage $V_{swi}$ that turns off the switching transistor pair circuit 604-$i$. At the same time, in accordance with the control signal $S_0$, the pair of switches 606-$i$ close to turn on the corresponding current buffer in the cascode amplifier 602-$i$ and the corresponding transconductor in the cascode amplifier 602-$i$+1. As a result, for example, the pair of switches 606-$i$ would couple each of the bias terminal VB2 of the cascode amplifier 602-$i$ and the bias terminal VB1 of the cascode amplifier 602-$i$+1 to a bias voltage. By turning on different combinations of the switching transistor pair circuits 604-1, 604-2, ..., 604-M−1 and turning off each corresponding transconductor and current buffer in the M cascode amplifiers 602-1, 602-2, ..., 602-M, the amplifier 600 may provide a variable gain.

Further, in the exemplary embodiment of FIG. 6, the first cascode amplifier 602-1 has two input terminals in correspondence with the cascode amplifier 300 in FIGS. 3A and 3B. Alternatively, the first cascode amplifier 602-1 may have one input terminal in correspondence with the cascode amplifier 300 in FIG. 3C.

Other embodiments of the invention will be apparent to those skilled in the art from consideration of the specification and practice of the invention disclosed here. This application is intended to cover any variations, uses, or adaptations of the invention following the general principles thereof and including such departures from the present disclosure as come within known or customary practice in the art. It is intended that the specification and examples be considered as exemplary only, with a true scope and spirit of the invention being indicated by the following claims.

It will be appreciated that the present invention is not limited to the exact construction that has been described above and illustrated in the accompanying drawings, and that various modifications and changes can be made without departing from the scope thereof. It is intended that the scope of the invention only be limited by the appended claims.

What is claimed is:

1. A variable gain amplifier to convert an amplifier input voltage to an amplifier output voltage, the variable gain amplifier comprising:
   a plurality of cascode amplifiers coupled in series;
   a plurality of switching transistor pair circuits coupled in series; and
   a bias circuit coupled to provide bias voltages to each of the plurality of cascode amplifiers;
   wherein each of the switching transistor pair circuits is further coupled between two consecutive ones of the cascode amplifiers;
   a first one of the cascode amplifiers is configured to receive the amplifier input voltage; and
   a last one of the cascode amplifiers is configured to provide the amplifier output voltage.

2. The variable gain amplifier of claim 1, wherein the first one of the cascode amplifiers comprises:
   a first input terminal to receive the amplifier input voltage;
   a transconductor coupled to the first input terminal to convert the amplifier input voltage to a current;
   a current buffer coupled in series with the transconductor to receive the current; and
   a load coupled in series with the current buffer to convert the current to a differential output voltage;
   wherein the transconductor comprises:
      a first bias terminal to receive one of the bias voltages provided by the bias circuit;
      a first transistor having a first gate terminal, a first source terminal, and a first drain terminal, the first gate terminal being coupled to the first bias terminal via a first resistor; and
      a second transistor having a second gate terminal, a second source terminal, and a second drain terminal, the second gate terminal being coupled to the first bias terminal via a second resistor and coupled to the first source terminal via a first capacitor, the first gate terminal being coupled to the second source terminal via a second capacitor;
      wherein the first source terminal is further coupled to the first input terminal via a third capacitor.

3. The variable gain amplifier of claim 1, wherein one of the plurality of cascode amplifiers is configured to convert a differential input voltage to a differential output voltage, the one of the cascode amplifiers comprising:
   a transconductor to convert the differential input voltage to a current;
   a current buffer coupled in series with the transconductor to receive the current; and
   a load coupled in series with the current buffer to convert the current to the differential output voltage.

4. The variable gain amplifier of claim 3, wherein the bias circuit is coupled to provide one of the bias voltages to the transconductor via a switch.

5. The variable gain amplifier of claim 3, wherein the bias circuit is coupled to provide one of the bias voltages to the current buffer via a switch.

6. The variable gain amplifier of claim 3, wherein the one of the cascode amplifiers further comprises:
   first and second input terminals to receive the differential input voltage;
   first and second switching terminals coupled to the transconductor and the current buffer to provide the current;
   first and second output terminals coupled to the current buffer and the load to provide the differential output voltage;
   a first bias terminal, coupled to the transconductor, to receive a first one of the bias voltages; and
   a second bias terminal, coupled to the current buffer, to receive a second one of the bias voltages.

7. The variable gain amplifier of claim 6, wherein the transconductor comprises:
   a first transistor having a first gate terminal, a first source terminal, and a first drain terminal, the first gate terminal being coupled to the first input terminal and the first bias terminal, the first drain terminal being coupled to the first switching terminal; and
   a second transistor having a second gate terminal, a second source terminal, and a second drain terminal, the second gate terminal being coupled to the second input terminal and the first bias terminal, the second drain terminal being coupled to the second switching terminal.

8. The variable gain amplifier of claim 7, wherein:
the first gate terminal is coupled to the first input terminal via a first capacitor and coupled to the first bias terminal via a first resistor; and
the second gate terminal is coupled to the second input terminal via a second capacitor and coupled to the first bias terminal via a second resistor.

9. The variable gain amplifier of claim 7, wherein the first and second source terminals are coupled together to a current source.

10. The variable gain amplifier of claim 7, wherein the first and second source terminals are coupled together to ground.

11. The variable gain amplifier of claim 6, wherein the current buffer comprises:
a first transistor having a first gate terminal, a first source terminal, and a first drain terminal, the first transistor being coupled between the first switching terminal and the first output terminal, the first gate terminal being coupled to the second bias terminal; and
a second transistor having a second gate terminal, a second source terminal, and a second drain terminal, the second transistor being coupled between the second switching terminal and the second output terminal, the second gate terminal being coupled to the second bias terminal.

12. The variable gain amplifier of claim 11, wherein:
the first gate terminal is coupled to the second bias terminal via a first resistor and coupled to the second source terminal via a first capacitor; and
the second gate terminal is coupled to the second bias terminal via a second resistor and coupled to the first source terminal via a second capacitor.

13. The variable gain amplifier of claim 3, wherein the load comprises at least a resistor.

14. The variable gain amplifier of claim 3, wherein the load comprises at least an inductor.

15. The variable gain amplifier of claim 3, wherein the load comprises at least a MOS transistor.

16. The variable gain amplifier of claim 3, wherein the load comprises at least one of a resistor, an inductor, or a MOS transistor, or a combination thereof.

17. The variable gain amplifier of claim 1, wherein the switching transistor pair circuit comprises:
first and second input terminals;
first and second output terminals; and
first and second transistors having first and second gate terminals, respectively;
wherein the first and second gate terminals are coupled together to receive a switching voltage.

18. The variable gain amplifier of claim 1, wherein the switching transistor pair circuit comprises:
first and second input terminals;
first and second output terminals; and
a plurality of transistor pairs coupled in series, each of the transistor pairs including first and second transistors having first and second gate terminals, respectively;
wherein the first and second gate terminals are coupled together to receive a switching voltage.

19. The variable gain amplifier of claim 18, wherein the plurality of transistor pairs include all NMOS transistors, or all PMOS transistors, or NMOS and PMOS transistors.

20. A variable gain amplifier to convert an amplifier input voltage to an amplifier output voltage, the variable gain amplifier comprising:
first and second cascode amplifiers coupled in series;
a switching transistor pair circuit coupled to the first and second cascode amplifiers; and
a bias circuit coupled to provide bias voltages to each of the first and second cascode amplifiers;
wherein the first cascode amplifier is configured to receive the amplifier input voltage, and the second cascode amplifier is configured to provide the amplifier output voltage, and
wherein the switching transistor pair circuit comprises:
first and second in input terminals;
first and second output terminals; and
first and second transistors having first and second gate terminals, respectively, the first and second gate terminals being coupled together to receive a switching voltage.

21. The variable gain amplifier of claim 20, wherein the first cascode amplifier comprises:
an input terminal to receive the amplifier input voltage;
a transconductor coupled to the input terminal of the first cascode amplifier to convert the amplifier input voltage to a current;
a current buffer coupled in series with the transconductor to receive the current; and
a load coupled in series with the current buffer to convert the current to a differential output voltage;
wherein the transconductor comprises:
a bias terminal to receive one of the bias voltages provided by the bias circuit;
a third transistor having a gate terminal, a source terminal, and a drain terminal, the gate terminal of the third transistor being coupled to the bias terminal via a first resistor; and
a fourth transistor having a gate terminal, a source terminal, and a drain terminal, the gate terminal of the fourth transistor being coupled to the bias terminal via a second resistor and coupled to the source terminal of the third transistor via a first capacitor, the gate terminal of the third transistor being coupled to the source terminal of the fourth transistor via a second capacitor;
wherein the source terminal of the third transistor is further coupled to the input terminal of the first cascode amplifier via a third capacitor.

22. The variable gain amplifier of claim 20, wherein one of the first and second cascode amplifiers comprises:
a transconductor to convert a differential input voltage to a current;
a current buffer coupled in series with the transconductor to receive the current; and
a load coupled in series with the current buffer to convert the current to a differential output voltage.

23. The variable gain amplifier of claim 22, wherein the one of the first and second cascode amplifiers further comprises:
first and second input terminals to receive the differential input voltage;
first and second switching terminals coupled to the transconductor and the current buffer to provide the current;
first and second output terminals coupled to the current buffer and the load to provide the differential output voltage;
a first bias terminal, coupled to the transconductor, to receive a first one of the bias voltages; and
a second bias terminal, coupled to the current buffer, to receive a second one of the bias voltages.

24. The variable gain amplifier of claim 23, wherein the transconductor comprises:
- a third transistor having a gate terminal, a source terminal, and a drain terminal, the gate terminal of the third transistor being coupled to the first input terminal of the one of the cascode amplifiers and the first bias terminal, the drain terminal of the third transistor being coupled to the first switching terminal; and
- a fourth transistor having a gate terminal, a source terminal, and a drain terminal, the gate terminal of the fourth transistor being coupled to the second input terminal of the one of the cascode amplifiers and the first bias terminal, the drain terminal of the fourth transistor being coupled to the second switching terminal.

25. The variable gain amplifier of claim 20, wherein the switching transistor pair circuit comprises:
- a plurality of transistor pairs coupled in series.

26. The variable gain amplifier of claim 25, wherein the plurality of transistor pairs include all NMOS transistors, or all PMOS transistors, or NMOS and PMOS transistors.

* * * * *